(12) United States Patent
Lin et al.

(10) Patent No.: US 7,973,244 B2
(45) Date of Patent: Jul. 5, 2011

(54) PRINTED CIRCUIT BOARD

(75) Inventors: Yu-Hsu Lin, Taipei Hsien (TW);
Chan-Fei Tai, Taipei Hsien (TW);
Jeng-Da Wu, Taipei Hsien (TW);
Chih-Hang Chao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 11/765,453

(22) Filed: Jun. 20, 2007

(65) Prior Publication Data

US 2008/0186687 A1 Aug. 7, 2008

(30) Foreign Application Priority Data

Feb. 7, 2007 (CN) .......................... 2007 1 0200165

(51) Int. Cl.
*H05K 1/03* (2006.01)

(52) U.S. Cl. ...................................... 174/255; 174/261
(58) Field of Classification Search .................. 174/255, 174/260
See application file for complete search history.

(56) References Cited

U.S. PATENT DOCUMENTS

| | | | |
|---|---|---|---|
| 6,447,886 B1 | 9/2002 | Mohamed et al. | |
| 7,022,919 B2 * | 4/2006 | Brist et al. ...................... | 174/260 |
| 2005/0034893 A1 * | 2/2005 | McCall et al. ................ | 174/255 |
| 2006/0076683 A1 * | 4/2006 | Nishida ......................... | 257/758 |
| 2006/0144616 A1 | 7/2006 | Lin et al. | |
| 2007/0182436 A1 * | 8/2007 | Freda et al. .................... | 324/765 |

* cited by examiner

*Primary Examiner* — Ishwarbhai B Patel
(74) *Attorney, Agent, or Firm* — Frank R. Niranjan

(57) ABSTRACT

A printed circuit board includes a base formed from a plurality of woven fibers, and signal traces laid on the base. Each of the signal traces includes at least a straight line segment. The signal traces are laid on the base in such a manner that the line segments of the signal traces mapped on the base cross the fibers at angles not equal to zero degrees.

8 Claims, 8 Drawing Sheets

PRINTED CIRCUIT BOARD

BACKGROUND OF THE INVENTION

1. Field of the Invention

The present invention relates to a printed circuit board, and more particularly to a printed circuit board having high signal transmission quality.

2. Description of Related Art

Printed circuit boards (PCBs) typically consist of three principal components: a base, resin, and copper foil. The base for a PCB is often constructed from woven glass fiber cloth. In the process for manufacturing the PCB, the base is treated by passing it through a dip pan containing resin. The treated base is then passed through a set of squeeze rollers, and then a drying oven to cure. Then, the base is cut into a sized base which has a size of the PCB. Once the base has been prepared, copper foil is applied to one or two sides of the base, typically by electrodeposition. The copper foil is etched to form different signal traces on the PCB.

Referring to FIGS. 1 and 2, a PCB 1 includes a base 10 which includes a set of first fibers 11 and a set of second fibers 12. The PCB 1 defines an X-axis extending in a horizontal direction, and a Y-axis perpendicular to the X-axis. The set of first fibers 11 of the base 10 disposed in the X-axis direction are interlaced with the set of second fibers 12 of the base 10 disposed in the Y-axis direction. Resin is impregnated in gaps 13 among the fibers 11 and 12. Generally, each straight line segment of a signal trace 17 is arranged on the PCB 1 at an angle of 0, 45, 90, −45 degrees relative to the X-axis. In a PCB, some line segments of the signal traces 17 will cross the fibers 11 or 12 of the base 10 (such as the line segment of the signal traces 17 arranged at the angles of 45, −45 degrees of FIG. 1), and some line segments of signal traces will be coincident with the fibers 11 or 12 of base 10 (such as the line segment of signal traces arranged at the angles of 0, 90 degrees of FIG. 1). Because the fibers 11, 12 and the resin have different dielectric constants, impedances of different signal traces 17 vary over a large range according to the locations and the angles of the line segments of the signal traces 17 relative to the base 10. However, in a PCB, if the impedances of different signal traces vary greatly, the delay times of signals on different signal traces will be very different.

SUMMARY OF THE INVENTION

A printed circuit board includes a base formed from a plurality of woven fibers, and signal traces laid on the base. Each of the signal traces includes at least a straight line segment. The signal traces are laid on the base in such a manner that the line segments of the signal traces mapped on the base cross the fibers at angles not equal to zero degrees.

Other advantages and novel features of the present invention will become more apparent from the following detailed description of preferred embodiment when taken in conjunction with the accompanying drawings, in which:

DETAILED DESCRIPTION OF THE INVENTION

Figure 1:
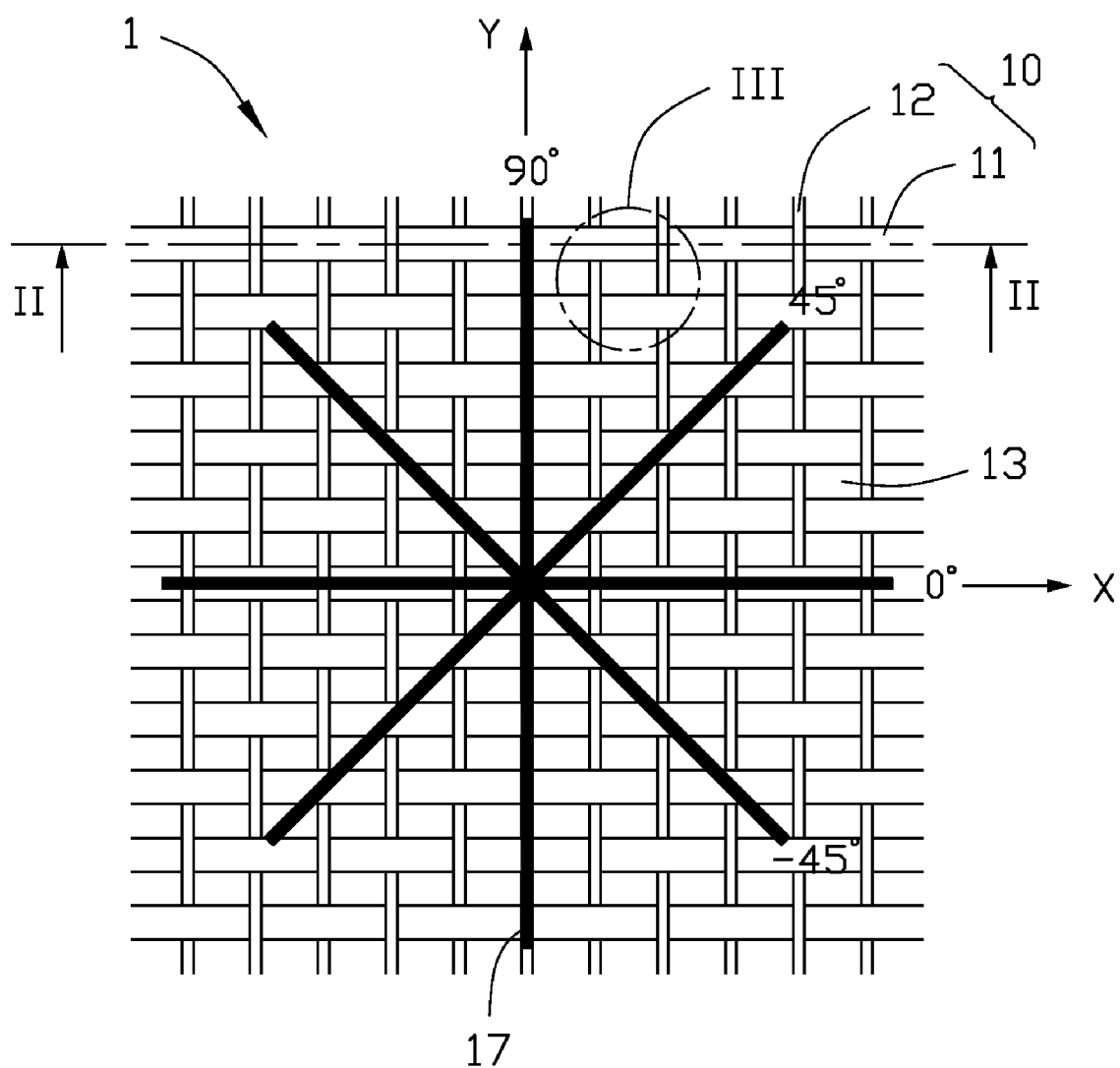
FIG. 1 is a schematic view of a conventional PCB including a first kind of base and a plurality of signal traces.
Figure 2:
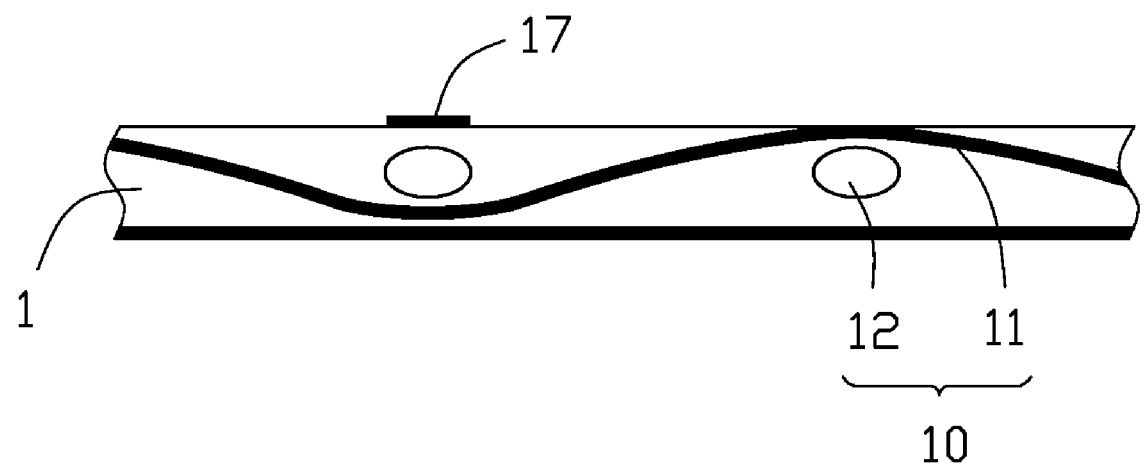
FIG. 2 is a cross sectional view taken along line II-II in FIG. 1.
Figure 3:
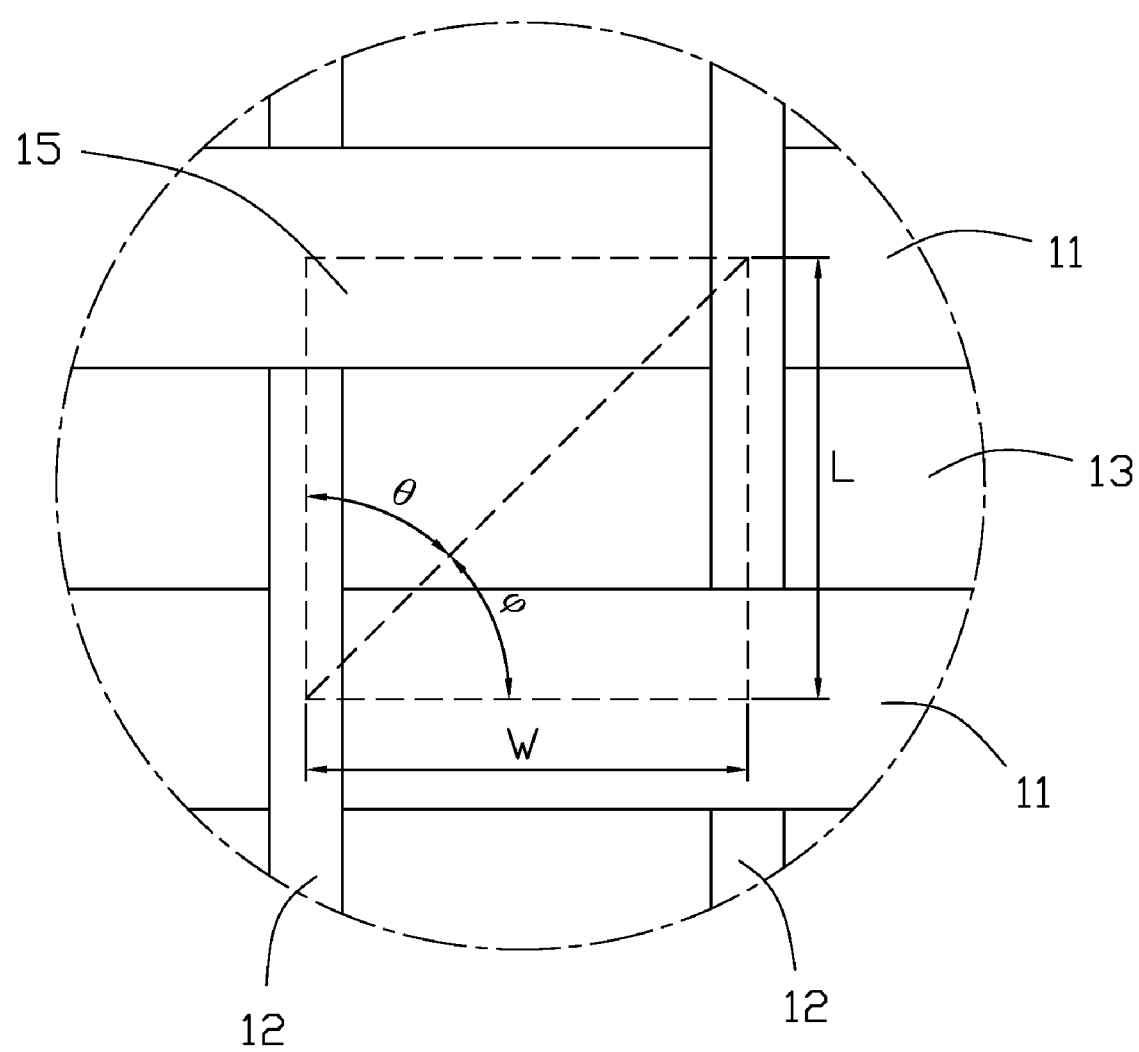
FIG. 3 is an enlarged view of an encircled portion III of FIG. 1.

Referring to FIG. 3, an enlarged encircled portion III of the base 10 of FIG. 1 is shown. Two adjacent parallel first fibers 11 and two adjacent parallel second fibers 12 perpendicular to the fibers 11, together define a square area 15 (shown with dashed lines in FIG. 3) that is L long along the fibers 11 and W wide along the fibers 12, wherein $L=17.86\times10^{-3}$ inches, and $W=17.86\times10^{-3}$ inches. An angle $\phi$ between the first fiber 11 and a diagonal of the area 15 is 45 degrees. An angle $\theta$ between the second fiber 12 and the diagonal of the area 15 is also 45 degrees.

Figure 4:
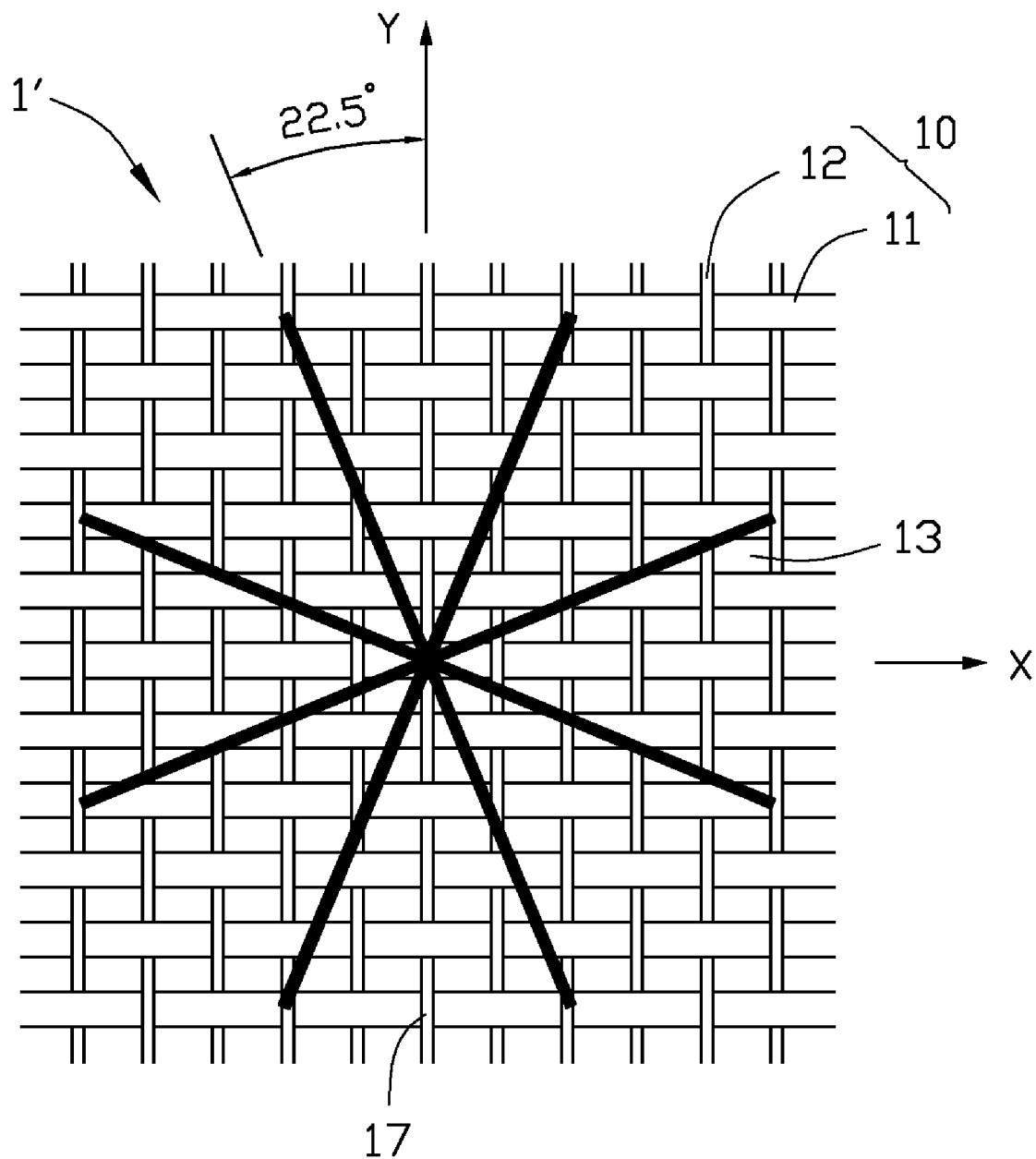
FIG. 4 is a schematic view of a PCB in accordance with a preferred embodiment of the present invention applied on the first kind of base of FIG. 1.

Referring to FIG. 4, when the signal traces 17 of the PCB 1 in FIG. 1 is rotated an angle $\alpha$ which is equal to half of one of the angles $\phi$, $\theta$ and is 22.5 degrees in this embodiment relative to the Y-axis in a counter-clockwise direction on the PCB 1 with other elements on the PCB 1 remaining unchanged we achieve PCB 1' of a first embodiment of the present invention. On the PCB 1', any line segment of the signal traces 17 is not coincident with the fibers 11, 12 and the diagonals of the areas 15 of base 10. The angle between any line segment of the signal traces 17 and any fiber 11 or 12 is not smaller than 22.5 degrees. So the impedances of the signal traces 17 are kept in a small range to improve signal transmission quality.

It is to be understood that in the above embodiment the signal traces 17 also can be rotated in a clockwise direction, or rotates the base 10 relative to the signal traces 17. Furthermore, the value of the rotated angle $\alpha$ is not limited to half of the angles $\phi$, $\theta$. Any angle can be used in the present invention as long as any line segments of the signal traces 17 are not coincident with the fibers 11, 12 and the diagonals of the areas 15 of base 10 after rotation.

Figure 5:
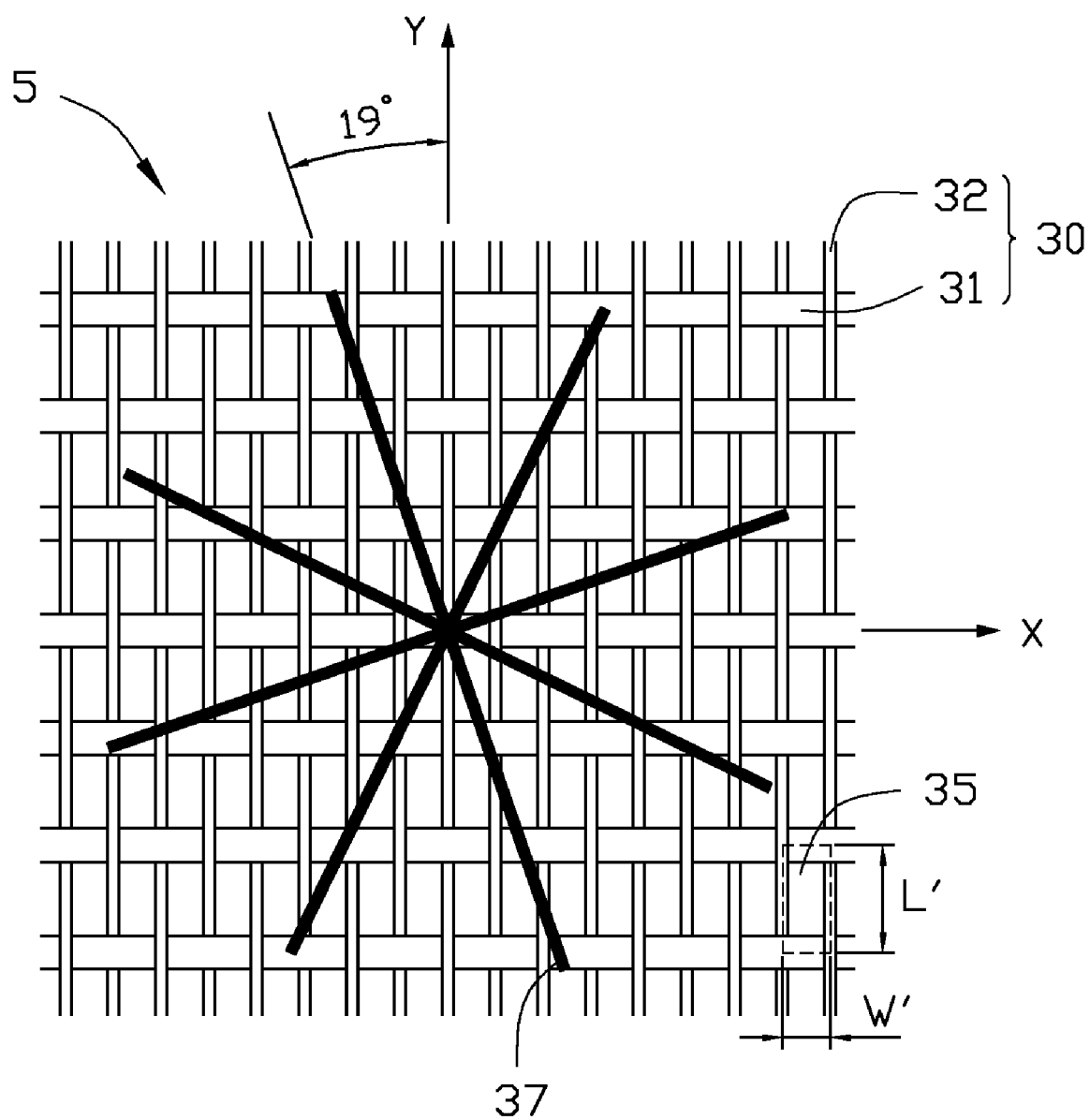
FIG. 5 is a schematic view of another PCB in accordance with a preferred embodiment of the present invention applied on a second kind of base.

Referring to FIG. 5, a second kind of base 30 is placed on a plane 5. The plane 5 defines an X-axis extending in a horizontal direction, and a Y-axis perpendicular to the X-axis. The base 30 includes a set of first fibers 31 and a set of second fibers 32. The set of first fibers 31 of the base 30 disposed in the X-axis direction are interlaced with the set of second fibers 32 of the base 30 disposed in the Y-axis direction. Two adjacent parallel first fibers 31 and two adjacent parallel second fibers 32 perpendicular to the fibers 31, together define a rectangular area 35 (shown with dashed lines in FIG. 5) that is L' long and W' wide, wherein $L'=21.28\times10^{-3}$ inches, and $W'=16.67\times10^{-3}$ inches. An angle $\phi'$ between the first fiber 31 and a diagonal of the area 35 is arc tan $L'/W'=52$ degrees. An angle $\theta'$ between the second fiber 32 and the diagonal of the area 35 is arc tan $W'/L'=38$ degrees. When the rectangular area 35 is not square-shaped, an angle $\alpha'$ being equal to half of the smaller one of the angles $\phi'$, $\theta'$ is set, in the second embodiment angle $\alpha'=19$ degrees.

In normal manner for laying signal traces on the base 30, signal traces are laid on the base 31 to have one of the straight line segments of the signal traces been coincident with the X-axis of the base 30, for example, the straight line segments of the signal traces arranged on the base 30 at an angle of 0, 45, 90, −45 degrees relative to the X-axis of the base 30. However, to achieve the second embodiment of the present invention, each signal trace 37 laid on the base 31 in an abnormal manner is rotated 19 degrees relative to the original position of each signal trace 37 laid in the normal manner. Thus, the straight line segments of the signal traces 37 are arranged on the base 30 at an angle of 19, 64, 109, −26 degrees relative to the X-axis of the base 30. So the line segments of the signal traces 37 are not coincident with the fibers 31, 32 and the diagonals of the areas 35 of the base 30. The impedances of the signal traces 37 are kept in a small range thereby providing quality signal transmission.

Figure 6:
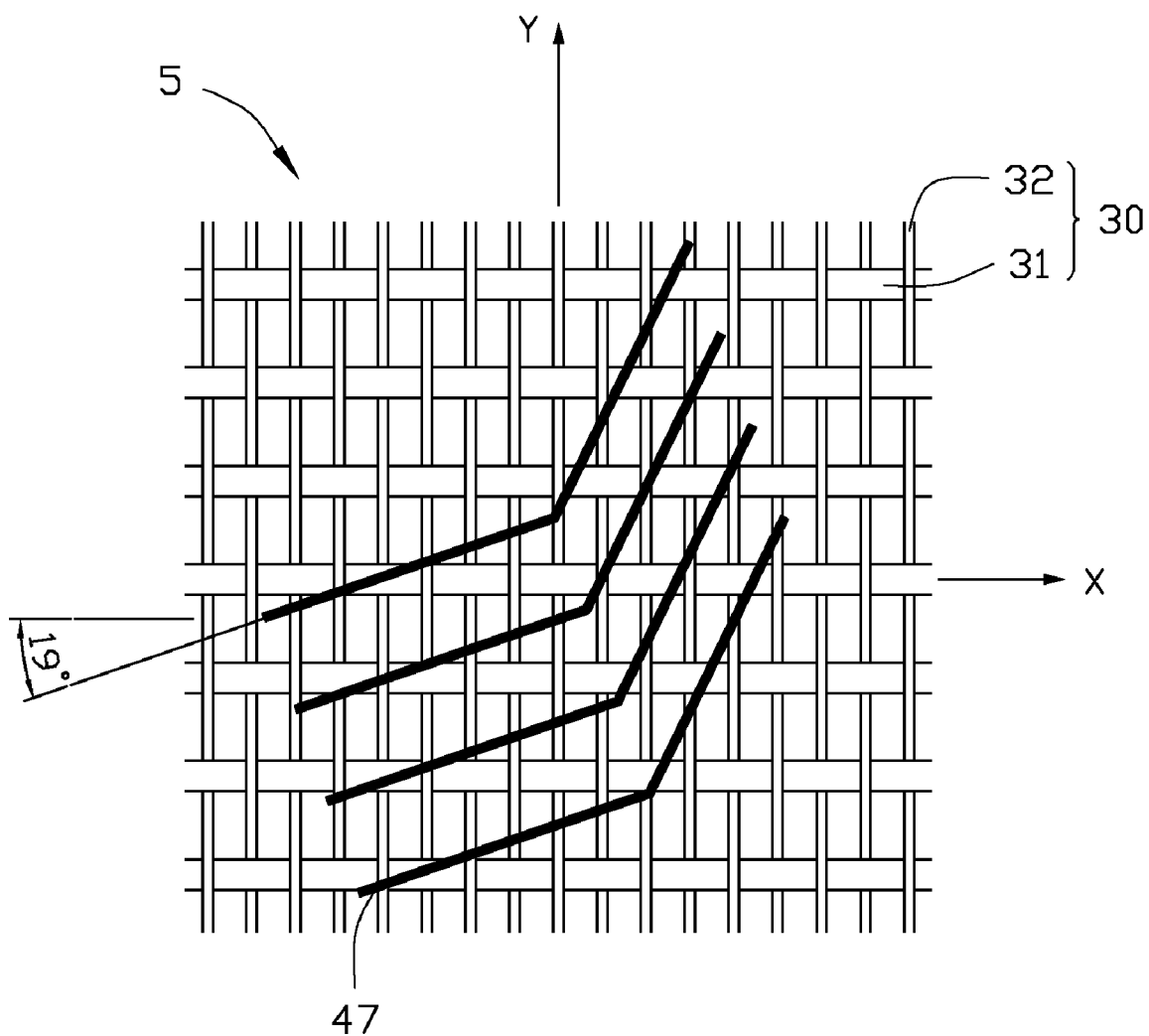
FIG. 6 is a schematic view of another PCB in accordance with another preferred embodiment of the present invention applied on the second kind of base of FIG. 5.

Referring to FIG. 6, a set of parallel signal traces 47 are laid on the base 30. The parallel signal traces 47 are laid in the abnormal manner as described above. Any line segment of the signal traces 47 is not coincident with the fibers 31, 32 and the diagonals of the areas 35 of the base 30. The impedances of the set of signal traces 47 are substantially uniform, and the delay times of signals on the set of parallel signal traces 47 will be uniform.

Figure 7:
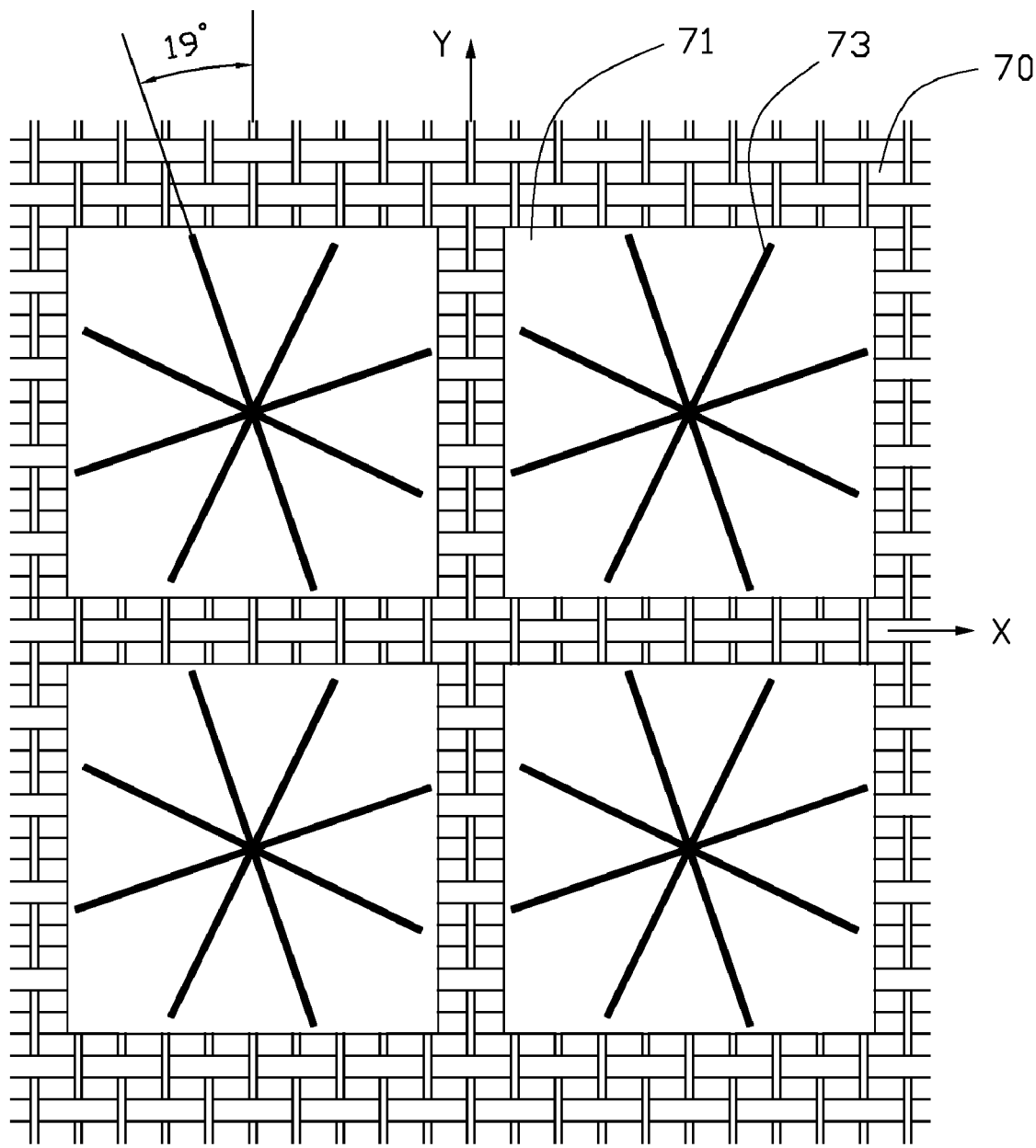
FIG. 7 is a schematic view of a first manner to produce the PCB of the present invention.

To achieve the PCBs in the above embodiment, there are several different manners. FIG. 7 shows a kind of manner. A large base 70 is prepared firstly. The base 70 is constructed from the same glass fiber cloth as the base 30 of FIG. 5. The base 70 also defines the X-axis along which the parallel first fibers extend, and the Y-axis perpendicular to the X-axis. The parallel second fibers extend along the Y-axis. The base 70 is then cut into four rectangular uniform sized bases 71, which have the same size of the final PCB, in a normal manner which means two parallel edges of the sized bases 71 are parallel to the first fibers and the other two parallel edges of the sized bases 71 are parallel to the second fibers. In normal manner for laying signal traces, signal traces are laid on the sized base 71 to have one of the straight line segments of the signal traces been coincident with the X'-axis of the base 70, for example, the straight line segments of the signal traces arranged on the sized base 71 at an angle of 0, 45, 90, −45 degrees relative to the X-axis of the base 70. However, to achieve the embodiments of the present invention, each signal trace 73 is laid on the sized base 71 in an abnormal manner and is rotated an angle relative to the original position of each signal trace laid in the normal manner. In the base 70, the rotated angle is 19 degrees as that in the base 30 of FIG. 5. Thus, the straight line segments of the signal traces 73 are arranged on the sized base 71 at an angle of 19, 64, 109, −26 degrees relative to the X'-axis of the base 70. So substantially all line segments of substantially all signal traces 73 mapped on the base cross the fibers of the base 70 at angles not equal to zero degrees.

Figure 8:
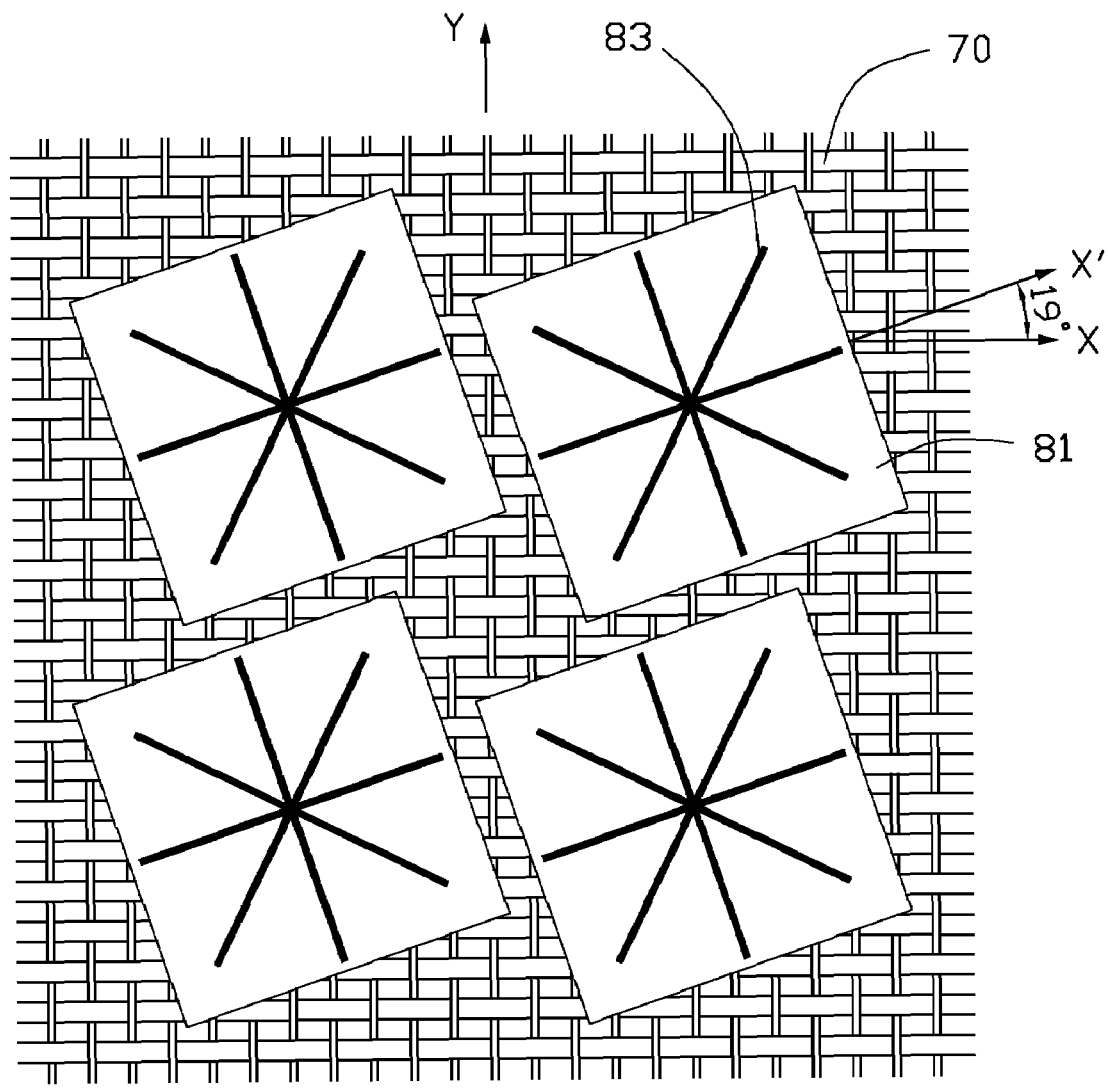
FIG. 8 is a schematic view of a second manner to produce the PCB of the present invention.

FIG. 8 shows another kind of manner to product the PCBs. The base 70 is cut into four rectangular sized bases 81 in an abnormal manner to have two parallel edges of each sized base 80 crossing the X-axis direction of the base 81 with an oblique angle. The oblique angle is 19 degrees. The sized base 81 defines an X'-axis angled relative to the X-axis with 19 degrees. Signal traces 83 are laid on the sized base 81 in the normal manner which means one of the straight line segments of the signal traces being coincident with the X"-axis of the sized base 80, for example, the straight line segments of the signal traces 81 being arranged on the sized base 81 at angles of 0, 45, 90, or −45 degrees relative to the X"-axis of the sized base 81. So substantially all line segments of substantially all signal traces 83 mapped on the base cross the fibers of the base 70 at angles not equal to zero degrees.

After the invention was made, applicants tested the invention to measure the signal delay times of different signal traces, and compare the data with measured delay times of a conventional PCB. A conventional PCB, using the base 30 of FIG. 5 without rotation, was found to have delay times of $152.8 \times 10^{-12}$ seconds per inch when signals were transmitted through signal traces having line segments coincident with the fibers 31 or 32. If line segments of the signal traces crossed over the fibers 31 or 32 of the base 30 at an angle, the delay times were found to be $148.6 \times 10^{-12}$ seconds per inch, a difference between two delay times of $4.2 \times 10^{-12}$ seconds per inch. On the PCB of the present invention (rotated as in FIG. 6) however, signal traces with line segments extending 0 or 90 degrees relative to the X' axis, had delay times of $150.3 \times 10^{-12}$ seconds per inch, and signal traces with line segments extending 45 or −45 degrees relative to the X' axis, had delay times of $150.4 \times 10^{-12}$ seconds per inch, a difference of only $0.1 \times 10^{-12}$ seconds per inch. From the above data, it is apparent that signal transmission quality is improved when using the present invention.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board, comprising:
    a base formed from a plurality of woven fibers; and
    signal traces laid on the base, each of the signal traces comprising at least a straight line segment, the signal traces laid on the base in such a manner that the line segments of the signal traces mapped on the base cross the fibers at angles not equal to zero degrees;
wherein the fibers comprise a set of parallel first fibers, and a set of parallel second fibers perpendicular to and interlaced with the set of first fibers, two adjacent first fibers and two adjacent second fibers define a rectangular area, a first angle is defined by the first fiber and the diagonal of the rectangular area, and a second angle is defined by the second fiber and the diagonal of the rectangular area, the angle defined by each line segment of each signal trace and each corresponding fiber is not smaller than half of the smaller of the first and second angles, each line segment of the signal trace mapped on the base crosses the diagonal of the rectangular area at angles not equal to zero degrees; and substantively no line segments are present on the board which are coincident with the fibers and the diagonal of the rectangular area.

2. The printed circuit board as described in claim 1, wherein the angle defined by each straight line segment of each signal trace and one corresponding fiber the straight line segment crossing is equal to half of the smaller one of the first and second angles.

3. The printed circuit board as described in claim 2, wherein the printed circuit board defines an X-axis along which the parallel first fibers extend, and a Y-axis perpendicular to the X-axis, and the straight line segments of the signal traces are arranged on the printed circuit board in a direction at an angle of α, 45+α, 90+α, or α−45 degrees relative to the X-axis of the printed circuit board, α is equal to half of the smaller one of the first and second angles.

4. The printed circuit board as described in claim 2, wherein the rectangular area is a square, the first angle is 45 degrees, the second angle is 45 degrees, the angle defined by each straight line segment of each signal trace and one corresponding fiber the straight line segment crossing is equal to 22.5 degrees.

5. A printed circuit board, comprising:
   a base formed from a plurality of woven fibers, the fibers comprising a set of parallel first fibers which are parallel to a first edge of the printed circuit board, and a set of parallel second fibers that are perpendicular to and intersect with the set of first fibers, the set of parallel second fibers being parallel to a second edge of the printed circuit board; two adjacent first fibers of the set of parallel first fibers and two adjacent second fibers of the set of parallel second fibers define a rectangular area; a first angle is defined by one of the two adjacent first fibers and the diagonal of the rectangular area, and a second angle is defined by one of the two adjacent second fiber and the diagonal of the rectangular area, and a third angle is defined and is equal to half of the smaller one of the first angle and the second angle; and
   a signal plane with a plurality of signal traces arranged thereon, each of the signal traces comprising a plurality of straight line segments; the plurality of straight line segments of each signal traces are arranged relative to the first edge or the second edge of the printed circuit board at about the third angle, about the 45 degree adding the third angle, or about 90 degree adding the third angle.

6. The printed circuit board as described in claim 5, wherein the first angle is 53 degrees, and the second angle is 38 degrees.

7. A printed circuit board, comprising:
   a base formed from a plurality of woven fibers; and
   signal traces located on the base, each of the signal traces comprising at least one straight line segment, the signal traces are arranged on the base in such a manner that the line segments of the signal traces mapped on the base intersect the fibers at angles not equal to zero degrees;
   wherein the fibers comprise a set of parallel first fibers, and a set of parallel second fibers that are perpendicular to and intersect with the set of first fibers, two adjacent first fibers of the set of parallel first fibers and two adjacent second fibers of the set of parallel second fibers define a rectangular area, a first angle is defined by one of the two adjacent first fibers and the diagonal of the rectangular area, and a second angle is defined by one of the two adjacent second fibers and the diagonal of the rectangular area, a third angle formed between crossed straight line segment and first fiber is equal to half of the smaller one of the first angle and second angle, a fourth angle formed between crossed straight line segment and second fiber is equal to half of the smaller one of the first angle and second angle.

8. The printed circuit board as described in claim 7, wherein the first angle is 53 degrees, and the second angle is 38 degrees.

* * * * *